(12) United States Patent
Petroz

(10) Patent No.: US 7,553,746 B2
(45) Date of Patent: Jun. 30, 2009

(54) METHOD FOR MANUFACTURING ELECTRODES ON A SEMICONDUCTING MATERIAL OF TYPE II-VI OR ON A COMPOUND OF THIS MATERIAL

(75) Inventor: Gérard Petroz, Montbonnot (FR)

(73) Assignee: Commissariat a l'Energie Atomique, Paris (FR)

( * ) Notice: Subject to any disclaimer, the term of this patent is extended or adjusted under 35 U.S.C. 154(b) by 303 days.

(21) Appl. No.: 10/528,436

(22) PCT Filed: Sep. 19, 2003

(86) PCT No.: PCT/FR03/50057

§ 371 (c)(1),
(2), (4) Date: Mar. 18, 2005

(87) PCT Pub. No.: WO2004/027854

PCT Pub. Date: Apr. 1, 2004

(65) Prior Publication Data

US 2006/0121716 A1 Jun. 8, 2006

(30) Foreign Application Priority Data

Sep. 20, 2002 (FR) .................................. 02 11675

(51) Int. Cl.
*H01L 21/28* (2006.01)
*H01L 21/44* (2006.01)

(52) U.S. Cl. ........................ 438/575; 438/580; 438/603; 438/686; 257/E21.698

(58) Field of Classification Search .................... 438/98, 438/102, 571, 575, 580, 603, 650, 678, 686; 205/560, 565, 570; 257/E21.543, E21.698
See application file for complete search history.

(56) References Cited

U.S. PATENT DOCUMENTS

| 2,865,793 A | | 12/1958 | De Nobel |
| 5,909,632 A | * | 6/1999 | Gessert ........................ 438/603 |
| 6,091,070 A | | 7/2000 | Lingren et al. ......... 250/370.09 |

FOREIGN PATENT DOCUMENTS

| EP | 0 674 348 A1 | 9/1995 |
| FR | 1 143 213 | 9/1957 |

OTHER PUBLICATIONS

Gostilo, V. et al., "Technological aspects of development of pixel and strip detectors based on CdTe and CdZnTe", *Nuclear Instruments & Methods in Physics Research, Section—A: Accelerators, Spectrometers, Detectors and Associated Equipment, North-Holland Publishing Company*, Amsterdam, NL, vol. 460, No. 1, pp. 27-34 (Mar. 11, 2001), Janik, E. et al., "Ohmic contacts to p-type cadmium telluride and cadmium mercury telluride", *Journal of Physics D: Applied Physics*, vol. 16, pp. 2333-2340 (1983), Ponpon, J. P., "A Review of Ohmic and Rectifying Contacts on Cadmium Telluride", *Solid-State Electronics*, vol. 28, No. 7, pp. 689-706 (1985).

* cited by examiner

*Primary Examiner*—Thanhha Pham
(74) *Attorney, Agent, or Firm*—Nixon Peabody LLP

(57) ABSTRACT

A method for manufacturing electrodes on a semiconducting material of type II-VI or on a compound of this material. The electrodes are preferably in gold or platinum and are formed by electrochemical deposition of gold or platinum from a solution of gold or platinum chloride in pure hydrochloric acid.

12 Claims, No Drawings

METHOD FOR MANUFACTURING ELECTRODES ON A SEMICONDUCTING MATERIAL OF TYPE II-VI OR ON A COMPOUND OF THIS MATERIAL

CROSS-REFERENCE TO RELATED APPLICATION

This application claims priority based on International Patent Application No. PCT/FR2003/050057, entitled "Method for the Production of Electrodes on a Type II or VI Semiconductor Material or on a Compound of Said Material" by Gerard Petroz, which claims priority of French Application No. 02/11675, filed on Sep. 20, 2002, and which was not published in English.

DESCRIPTION

1. Technical Field

The present invention relates to a method for manufacturing electrodes on a semiconducting material of type II-VI or on a compound of this material.

It particularly applies to X or gamma ray detectors and more particularly
  to blocks of individual detectors, capable of being juxtaposed in a detection array, and
  to monolithic detectors including multiple electrodes on one face (pixellization) and a biasing electrode on another face.

The invention in particular relates to the manufacturing of electrodes on detectors made from semiconducting materials of type II-VI such as CdZnTe, CdTe, CdTe:Cl, CdTeSe:Cl, CdZnTe;Cl, CdTe:In, CdZnTe:In and CdHgTe for example.

These tellurium- and cadmium-based semiconductors may be obtained with a Bridgman or THM type growth method for example and as a major feature, they have very high electrical resistivity (larger than $10^9$ Ω·cm) which is absolutely necessary for making X or gamma spectrometry devices dedicated to medical, industrial or scientific imaging.

The method, subject of the invention, may directly be used industrially because of its simplicity, its suitability for present products of the semiconductor industry (positive resists) and of its moderate price. It is particularly suitable for X or gamma detectors but is not limited to this application.

2. State of the Prior Art

Different types of radiation detectors are known, among which appear gas detectors, scintillator detectors, and semiconductor detectors. The latter have the advantage of having a large atomic number allowing a maximum number of incident photons to be absorbed for a minimum material thickness.

These semiconductor detectors generally are of a parallelepipedous shape and are cut out in an ingot slice, including at least two parallel faces on which electrical contacts are made for biasing the detectors and for collecting electrical signals produced by the incident radiations.

The electrical contacts should not notably change the behavior of the corresponding detector and therefore should have insignificant resistance to current, as compared with that of the material of the detector.

They should therefore be of the ohmic type, i.e., have a quasi-linear current-voltage characteristic and utilize a judicious band curvature at the metal-semiconductor contact, a tunnel effect at this location and recombinations in the space charge area.

Manufacturing of such ohmic contacts on the aforementioned materials (II-VI) remains a delicate problem to be solved, because, in addition to the suitable electrical behavior which should be obtained, these electrodes need to be connected to a read-out circuit, for example.

The connection should by no means change the electrical behavior of the contact. It generally induces stresses which the contact should be able to accept. Its adhesion is therefore essential all the more so as the materials in presence do not necessarily have the same expansion coefficients. Temperature variations therefore induce further constraints which may be very large. From now on, let us specify that the invention may be applied with compounds based on Cd and Te, of type p or type n.

In the case of CdTe and compounds of the latter having high resistivity, it is difficult to elaborate an ohmic contact because most metals have a work function less than that of CdTe, which is equal to 5.02 eV.

Only platinum (5.3 eV) and gold (4.8 eV) approach this value. Contacts made by vaporization or sputtering of both of these metals are neither ohmic nor blocking but are located between both of them. Other physico-chemical phenomena, such as surface states before depositing the metal or oxidizing the surface, set the height of the potential barrier regardless of the metal's work function.

It is possible to obtain an ohmic contact if the charge carriers may freely migrate by the tunnel effect. This transport mode is favored by electrochemical deposition of solutions of the gold chloride ($AuCl_3$) or platinum chloride ($PtCl_4$) type on a surface chemically etched beforehand. The metal is chemically reduced by tellurium and acts as a strong acceptor dopant at the surface of the detector. On this subject, reference will be made to the following document:

[1] J. P. Ponpon, Solid-state Electronics, Vol. 28, No.7, pp. 689-706, 1985.

As is seen, gold and platinum are among the best candidates for making high resistivity ohmic contacts on CdTe and on compounds of the latter. Their deposition is preferably achieved through an electrochemical route (to promote the tunnel effect), on a suitably prepared surface beforehand.

On this matter, reference will be made to the following document:

[2] E. Janick et al., J. Phys. D: Appl. Phys., 16 (1983), pp. 2333-2340.

Let us specify that CdTe or the compounds of the latter are used in the polycrystalline or monocrystalline form and are of type n or p.

Further, the structure of these materials induces a polarity: stoichiometry is different according to the relevant face. It is believed that this polarity induces specific mechanical and chemical behavior according to the relevant case.

Setting the detector to the desired dimensions is generally accomplished by cutting, grinding then polishing, which allows surfaces to be obtained, for which the perturbed thickness is minimal and may be removed by chemical etching without changing the flatness and the final dimensions too much, because this thickness may contain interfering contaminants from the electrical point of view and increase the resistance at the interface between the material of the detector and an electrical contact subsequently formed on the latter.

Two types of solutions are generally used for chemically preparing the surface:
  acid solutions based on potassium bichromate or a mixture of different acids such as HF, $HNO_3$, $H_2SO_4$, $CH_3COOH$;
  mixed acid/solvent solutions such as the Br-methanol solution, mostly used in the case of CdTe or a compound of the latter.

A large number of solutions are known. Their effect on surface stoichiometry may differ from one solution to another, in particular as to the adhesion of a metal layer, intended to form an electrical contact, and as to the electrical behavior of the detector, after completion of the latter.

Gold and platinum are well-suited for forming electrodes, in particular in the case of CdTe and of compounds of the latter. Deposited via an electrochemical (electroless) route, from a chloride of the relevant metal (gold or platinum), this metal takes the place of cadmium on the surface of the detector. As for cadmium, it enriches the solution used for depositing the metal.

This solution generally consists of gold or platinum chloride and water or optionally a solvent, such as for example ethylene glycol.

The maximum obtained thickness depends on the chloride concentration in the solution but it is generally less than 150 nm for Au and Pt, because of the polarization effect which is induced by the reaction for depositing the metal (Au or Pt).

The contacts formed with gold or platinum by electrochemical (electroless) coating on CeTe or on CdTe compounds should meet electrical specifications because there must be a low resistance at the metal/semiconductor interface in order to be able to collect the maximum number of charges from the detector;

mechanical specifications because there should be sufficient contact thickness, so that subsequent connection to another component does not deteriorate the underlying material or the characteristics of the latter, and sufficient adhesion in order to accept mechanical stresses due to the different expansion coefficients.

Indeed, since conductivity of CdTe is very low, any variation of temperature induces stresses in the electrical contact.

Further, in electrochemical (electroless) deposition itself, stresses increase with the thickness of the layer, which forces this thickness to be limited to 50 nm, hence risks of deteriorating the metal/semiconductor interface at the moment of the connection.

Stresses are also induced by a further possible deposit on the contact (for example a deposit of conducting adhesive) or by soldering (with a different material for example, indium for collective connections of the flip chip type and therefore an increase in temperature (about 160° C. for indium) with creation of an alloy.

Further, stresses are induced on the contact by assembly with a connection circuit or a read-out circuit in a casing.

Adhesion of the contact therefore depends on the surface preparation, on chemical reactions at the metal/semiconductor interface, on the thickness of the coating and also on the surface of the latter.

Now, the present trend in the nuclear detection field for example, is to manufacture pixellized monolithic detectors or juxtapose unit detectors. The surface of the contacts may then decrease from 5 $mm^2$ to 50 $\mu m^2$. Adhesion then becomes very critical.

Adhesion of the contacts is presently considered to be an important problem. On this matter, reference will be made to the following document:

[3] V. Gostilo et al., Nucl. Instr. and Meth. in Phys. Res. A 460 (2001), pp. 27-34.

Indeed, a gold layer deposited from an aqueous solution (respectively from a solution in a solvent such as ethylene glycol) withstands a peeling force not exceeding 1 $kg/cm^2$ (respectively 2 $kg/cm^2$) for a layer with a thickness less than 50 nm. For larger thicknesses, adhesion is strongly reduced.

As for platinum, when it is deposited from an aqueous solution at 30° C., adhesion is a little better but strongly drops when the thickness exceeds 100 nm.

DISCUSSION OF THE INVENTION

The object of the method, subject of the invention, is to form on a CdTe type material or on compounds of this material, electrodes which have good electric properties but especially a large thickness and adhering capacity. To do this, one proceeds with electrochemical (electroless) deposition of gold or platinum chloride in solution with pure hydrochloric acid.

Advantageously, preparing the surface of the material used (CdTe or a compound of CdTe) is performed from a solution of Br and preferably pure hydrochloric acid.

More generally, the present invention solves the problem of manufacturing electrodes on a semiconducting material of type II-VI, or on a compound of this material, these electrodes being able to have larger thickness and better adhesion onto the material than in the prior art.

Specifically, the object of the present invention is a method for manufacturing at least one electrode on a II-VI semiconducting material or a compound of this material, this electrode being in metal for which the work function is substantially equal to or larger than that of the II-VI semiconductor, this method being characterized in that the electrode is formed by electrochemical deposition of the metal from a solution of a chloride of the metal in pure hydrochloric acid.

Preferably, the metal is gold or platinum, and a gold or platinum chloride solution in pure hydrochloric acid is used.

Further, preferably, the concentration of gold or platinum chloride in the pure hydrochloric acid is less than 5%.

According to a preferred embodiment of the invention, the surface of the material is prepared before the deposition in order to make this surface capable of fixing the metal.

To do this, the material surface may be chemically etched.

In this case, according to a particular embodiment, the metal being gold or platinum, a gold or platinum chloride solution in pure hydrochloric acid is used and a solution of bromine and preferably pure hydrochloric acid, is used for the chemical etching.

Preferably, the material is CdTe. In this case, the electrode may for example be formed on a material which is selected from CdZnTe, CdTe:Cl, CdTeSe:Cl, CdZnTe:Cl, CdTe:In, CdZnTe:In and CdHgTe.

DETAILED DISCUSSION OF PARTICULAR EMBODIMENTS

With the invention, gold or platinum layers may be made, for which the thickness is between 100 nm and 150 nm and which withstand peeling forces larger than 10 $kg/cm^2$, by a suitable chemical preparation of the surface of CdTe or of a compound of the latter, followed by electrochemical (electroless) deposition of the metal from an acid solution.

More specifically, chemical preparation of the surface consists of removing the thickness damaged by the machining (grinding, polishing) and creating a surface to which a subsequent deposition is able to adhere and which is chemically favorable for obtaining a low resistance metal/semiconductor interface and this preparation is performed from a solution consisting of Br and preferably pure hydrochloric acid in a suitable proportion (a few % of Br).

The dissolution of Br in preferably pure hydrochloric acid is very slow and requires stirring for several minutes.

After chemical etching, the sample is rinsed (for example twice) in preferably pure hydrochloric acid then dried directly. It is not recommended to put it in presence of water.

The properly dried sample is then put into contact with the electrochemical (electroless) solution, the essential feature of which is that gold or platinum chloride is dissolved in pure hydrochloric acid.

The chloride concentration is preferably low (less than 1% in the case of gold chloride) because deposition kinetics is important for the final result.

When deposition is completed, rinsing is performed in hydrochloric acid then in water, followed by suitable drying.

The whole of this method is applied in an acid medium, which leads to protecting the portions of the sample which must not undergo chemical etching or receive the metal coating, with positive photoresists which are conventionally used in the semiconductor industry.

These positive resists are soluble in standard solvents such as methanol for example. Now, the chemical preparation of a surface is very often carried out with a Br-methanol mixture.

Furthermore, deposition of gold is also sometimes performed in presence of a solvent.

Further, the surface tension of both solutions (one for the preparation and the other for the deposition) is such that it allows the use of drops of these solutions and therefore chemical etches and coatings which are limited to the surfaces intended for the contact. These operations are unachievable with the Br-methanol mixture or with chloride solutions in a solvent, such as ethylene glycol for example.

Let us also recall that chlorine is used as dopant in semiconducting materials, the chlorine containing medium being thereby favorable to such materials.

Comparative tests performed on the same material (CdTe) but with different contact technologies, show that the detection efficiency of detectors made with this method is at least equal to that of detectors made with conventional technologies.

Further, the useful life of the Br solution in hydrochloric acid is long (several days) whereas the conventional Br-methanol solutions only retain their aggressivity for a few hours because of evaporation of the bromine. In addition, the concentration for example of gold in the coating solution, is much less than that of conventional aqueous solutions (1 g for 30 $cm^3$ of water), which is of interest from the industrial point of view.

This method was applied on CdTe (HPBM) or CdTe:Cl (type p) unit detectors and also on pixellized monolithic detectors. Their electrical behavior shows substantial improvement and very high adhesion from the mechanical point of view.

Another example of the method, subject of the invention, is given hereafter, for making gold electrodes on a CdTe substrate.

To do this, a solution of gold chloride in pure hydrochloric acid is used, the concentration of gold chloride in this acid being less than 1%.

One then proceeds with electrochemical deposition of gold on the areas of the substrate where the intention is to form electrodes, by putting the solution in contact with these areas.

The portions of the substrate which are not intended to be put into contact with the solution, in particular the portions on which gold is not intended to be deposited, are protected beforehand. To do this, a protective coating is formed on these portions and the coating is removed after having deposited gold at the desired locations.

As a protective coating, a photoresist layer may be used for example.

In addition, it is preferable to prepare the surface of the substrate before depositing gold thereon, notably to make this surface capable of fixing gold.

To do this, one may proceed with chemical etching of this surface by means of a bromine solution in preferably pure hydrochloric acid. Preferably, the thereby etched surface is rinsed by means of the same acid then by water, and then it is dried.

As seen earlier, platinum may be used instead of gold.

Instead of a CdTe substrate, a substrate made out of a compound of CdTe may be used according to the invention for forming electrodes thereon. Examples of such a compound have already been given above.

It is recalled hereafter what is meant by pure hydrochloric acid.

Hydrochloric acid is a liquid which is obtained by dissolving hydrogen chloride (a gas with chemical formula HCl) in water. At the most, 37% (to 38%) by weight of HCl gas molecules may be dissolved in water. For this maximum concentration, one refers to "pure" hydrochloric acid. It is this liquid which is used in the present invention for the electrochemical deposition.

It should be noted that in the prior art (see for example French Patent FR 1 143 213 A) a solution of hydrochloric acid with a concentration between 0% and 20% is used. This means that to obtain such a solution, the pure acid has been diluted and the solution's concentration is between 0% of 37% of HCl gas and 20% of 37% of HCl gas.

The invention claimed is:

1. A method for manufacturing at least one electrode on a II-VI semiconducting material or a compound of the II-VI semiconductor material, the at least one electrode being in a metal for which the work function is substantially equal to or larger than that of the II-VI semiconducting material, this method being characterized in that the at least one electrode is formed by electrochemical deposition of the metal from a solution of a metal chloride in pure hydrochloric acid, the metal chloride being a chloride of said metal, and wherein pure hydrochloric acid is the liquid which is obtained by dissolving about 37% to about 38% by weight of hydrogen chloride gas molecules in water, wherein the at least one electrode comprises a layer of the metal having a thickness of about 100 nm to about 150 nm and being capable of withstanding a peeling force larger than about 10 kg/$cm^2$.

2. The method according to claim 1, wherein the metal is gold or platinum and a gold chloride solution or a platinum chloride solution in pure hydrochloric acid is used.

3. The method according to claim 2, wherein a concentration of gold chloride or platinum chloride in pure hydrochloric acid is less than 5%.

4. The method according to claim 1, wherein a surface of the II-VI semiconducting material or of the compound of the II-WI semiconductor material is prepared before the deposition in order to make this surface capable of fixing the metal.

5. The method according to claim 4, wherein the surface of the II-VI semiconducting material or of the compound of the II-WI semiconductor material is chemically etched in a solution comprising hydrochloric acid.

6. The method according to claim 5, wherein the metal is gold or platinum, a gold or platinum chloride solution in pure hydrochloric acid is used and a solution of bromine and hydrochloric acid is used for the chemical etching.

7. The method according to claim 6, wherein a solution of bromine and pure hydrochloric acid is used for the chemical etching.

8. The method according to claim 5, wherein the II-VI semiconducting material or the compound of the II-VI semiconducting material is rinsed in pure hydrochloric acid after chemically etching the surface of the II-VI semiconducting material or of the compound of the II-VI semiconducting material.

9. The method according to claim 1, wherein the II-VI semiconducting material is CdTe.

10. The method according to claim 9, wherein the at least one electrode is formed on a compound of CdTe which is selected from CdZnTe, CdTe:Cl, CdTeSe:Cl, CdZnTe:Cl, CdTe:In, CdZnTe:In and CdHgTe.

11. The method according to claim 1, wherein a concentration of the metal chloride in pure hydrochloric acid is less than 5%.

12. The method according to claim 1, wherein a rinse of the II-VI semiconducting material or the compound of the II-VI semiconducting material is performed in hydrochloric acid and then in water, after electrochemical deposition of the metal is completed.

* * * * *